United States Patent
Avanzino et al.

(10) Patent No.: US 6,326,305 B1
(45) Date of Patent: Dec. 4, 2001

(54) CERIA REMOVAL IN CHEMICAL-MECHANICAL POLISHING OF INTEGRATED CIRCUITS

(75) Inventors: Steven C. Avanzino, Cupertino; Diana M. Shonauer, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/730,696

(22) Filed: Dec. 5, 2000

(51) Int. Cl.[7] .................................. H01L 21/302
(52) U.S. Cl. .................. 438/687; 438/633; 438/692
(58) Field of Search ..................... 438/687, 691–693, 438/633, 672

(56) References Cited

U.S. PATENT DOCUMENTS

| | | | |
|---|---|---|---|
| 5,483,568 | * | 1/1996 | Yana et al. .................. 378/44 |
| 5,772,780 | * | 6/1998 | Homma et al. ................ 134/7 |
| 5,804,513 | * | 9/1998 | Sakatani et al. ............. 438/693 |
| 6,103,625 | * | 8/2000 | Marcyk et al. .............. 438/691 |
| 6,123,088 | * | 9/2000 | Ho .............................. 134/1.3 |
| 6,143,662 | * | 11/2000 | Rhoades et al. ............. 438/690 |
| 6,191,027 | * | 2/2001 | Omura ......................... 438/627 |
| 6,200,901 | * | 3/2001 | Hudson et al. .............. 438/697 |
| 6,221,775 | * | 4/2001 | Ference et al. .............. 438/691 |
| 6,232,231 | * | 5/2001 | Sethuraman et al. ......... 438/691 |

FOREIGN PATENT DOCUMENTS

158341 * 6/2000 (JP) ..................... H01L/21/304

* cited by examiner

Primary Examiner—Charles Bowers
Assistant Examiner—Thanh Nguyen
(74) Attorney, Agent, or Firm—Mikio Ishimaru

(57) ABSTRACT

An integrated circuit manufacturing method is provided having a semiconductor substrate with a semiconductor device. A device dielectric layer is formed on the semiconductor substrate. A channel dielectric layer on the device dielectric layer has an opening formed therein. A barrier layer lines the channel opening. A conductor core fills the opening over the barrier layer. The conductor core and barrier layer are chemical-mechanical polished. The dielectric layer is then chemically-mechanically polished using a slurry containing ceria, a Ce(IV) oxide. Residual ceria on the conductor core and dielectric layer is then removed using a reducing agent to react the Ce(IV) oxide to the Ce(III) oxide for removal in an aqueous solution.

23 Claims, 3 Drawing Sheets

CERIA REMOVAL IN CHEMICAL-MECHANICAL POLISHING OF INTEGRATED CIRCUITS

TECHNICAL FIELD

The present invention relates generally to semiconductor technology and more specifically to removal of chemical-mechanical polishing solutions in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metalization" and is performed using a number of different photolithographic, deposition, and removal techniques.

Briefly, individual semiconductor devices are formed in and on a semiconductor substrate and a device dielectric layer is deposited. Various techniques are used to form gate and source/drain contacts, which extend up to the surface of the device dielectric layer. In a process called the "damascene" technique, dielectric layers are deposited over the device dielectric layers and openings are formed in the dielectric layers. Conductor materials are deposited on the dielectric layers and in the openings. A process is used to planarize the conductor materials with the surface of the dielectric layers so as to cause the conductor materials to be "inlaid" in the dielectric layers.

More specifically for a single layer of interconnections, a "single damascene" technique is used in which the first channel formation of the single damascene process starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide fair barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit. However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

For more complex integrated circuits, a "dual damascene" technique is used in which channels of conductor materials are separated by interlayer dielectric layers in vertically separated planes and interconnected by vertical connections, or "vias".

More specifically, the dual damascene process starts with the deposition of a thin etch stop layer, or the via stop layer, over the first channels and the first channel dielectric layer. A via dielectric layer is deposited on the via stop layer. Again, where the via dielectric layer is of an oxide material, such as silicon oxide, the via stop layer is a nitride, such as silicon nitride, so the two layers can be selectively etched.

Second channel stop and second channel dielectric layers are formed on the via dielectric layer. Again, where the second channel dielectric layer is of an oxide material, such as silicon oxide, the second channel stop layer is a nitride, such as silicon nitride, so the two layers can be selectively etched. The second channel and via stop layers and second channel and via dielectric layers are then subject to further photolithographic process, etching, and photoresist removal steps to form via and second channel openings in the pattern of the second channels and the vias.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The capping layer may be an etch stop layer and may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metalization process. The elimination of metal etch steps is important as the semiconductor industry moves from aluminum (Al) to other metalization materials, such as copper, which are very difficult to etch.

One of the problems encountered during the process of forming copper (Cu) interconnects is that CMP is required. Unfortunately, ceria is difficult to remove from dielectric materials, such as silicon dioxide ($SiO_2$) and silicon nitride (SiN). The difficulty is due to the strong chemical bonding interactions of elemental cerium. Conventional removal methods use sulfuric acid ($H_2SO_4$) and hydrogen peroxide ($H_2O_2$) solutions at a very low pH under zero. These solutions are incompatible with water-brush scrubbers for cleaning semiconductor wafers.

A solution to this problem has been long sought but has long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric layer. A barrier layer is deposited to line the opening and a conductor core is deposited to fill the channel opening over the barrier layer. The barrier layer and the conductor core are subject to separate CMP processes. The dielectric layer is subject to a chemical-mechanical polishing (CMP) process using a slurry containing ceria, a Ce(IV) oxide. Residual ceria on the conductor core and dielectric layer is then removed after CMP using a reducing agent to react the Ce(IV) oxide to the Ce(III) oxide. The Ce(III) oxidation state is soluble in aqueous solutions compared to Ce(IV) oxide, which is insoluble in most reagents. This allows ceria to be compatible with water brush scrubbing systems.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
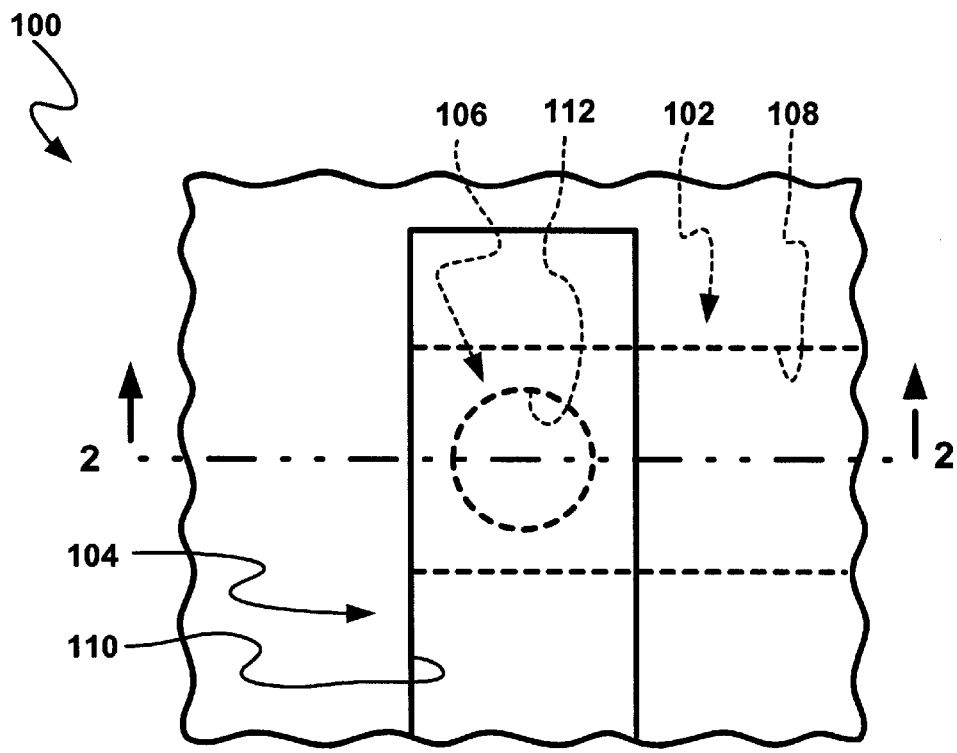
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
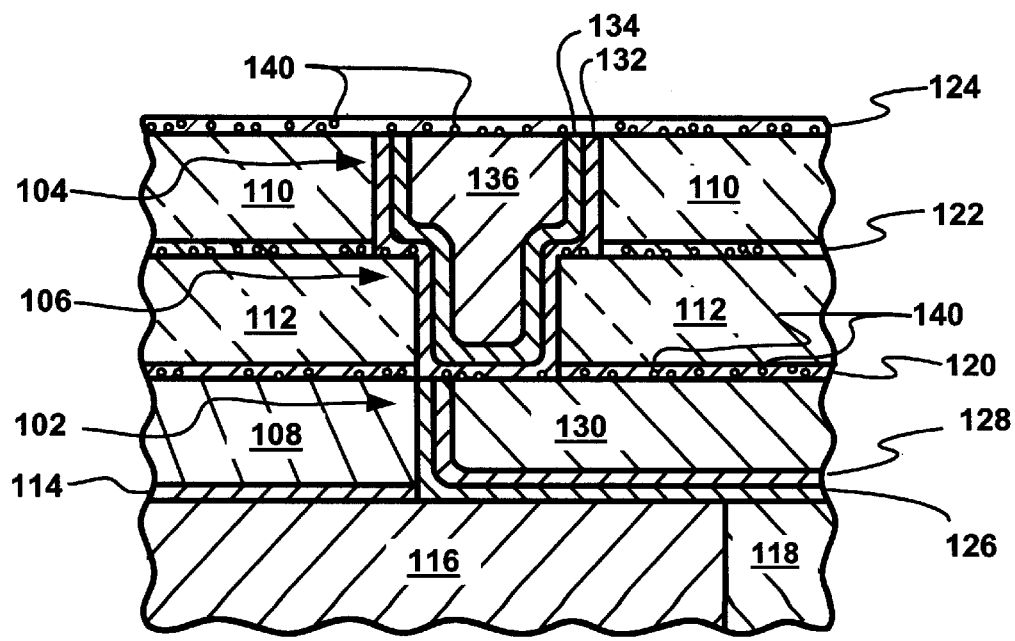
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device.

The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

During the manufacturing process, after deposition of the barrier layer 126, the seed layer 128, and the conductor core 130, chemical-mechanical polishing (CMP) processes are applied for planarization. The CMP of the first channel dielectric layer 108 uses a slurry containing ceria, or cerium oxide ($CeO_2$), as an abrasive. Unfortunately, ceria is difficult to remove from dielectric materials, such as silicon oxide ($SiO_2$) and silicon nitride (SiN). The difficulty is due to the strong chemical bonding interactions of elemental cerium.

In the past, conventional methods have used sulphuric acid ($H_2SO_4$) with hydrogen peroxide ($H_2O_2$) solutions at very low pH below zero for removal. In addition to causing problems with subsequently deposited layers, the $H_2SO_4$ and $H_2O_2$ solutions corrode the brushes, which are used in the water-brush scrubbing systems for cleaning the wafers after CMP.

Figure 3:
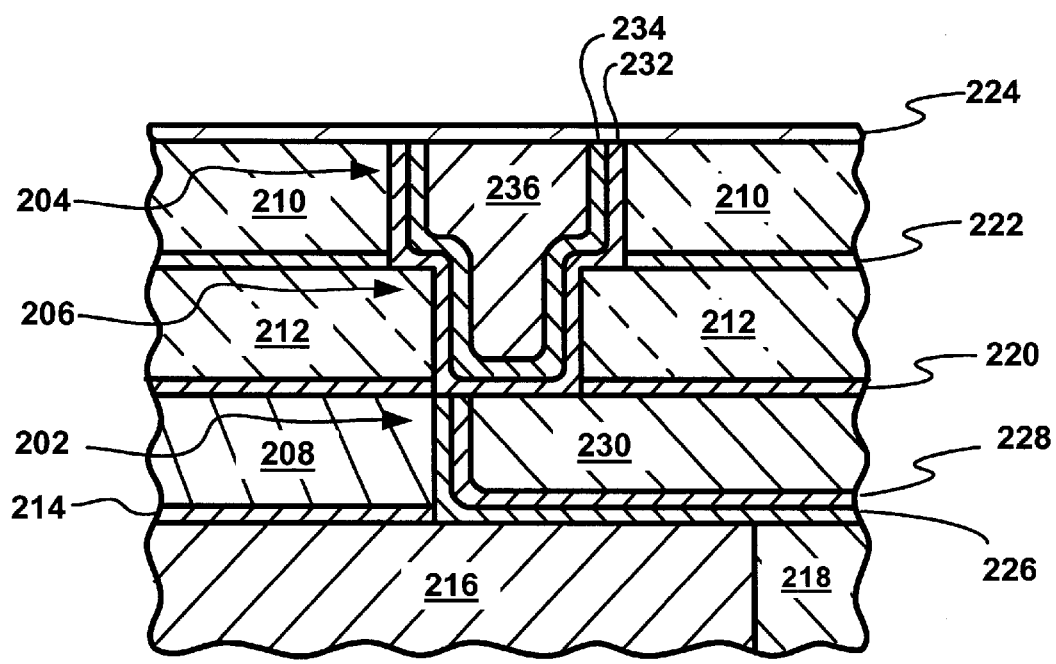
FIG. 3 is a cross-section similar to FIG. 2 (PRIOR ART) without the ceria particles shown in FIG. 2 (PRIOR ART)

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor contact 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 are deposited. The seed layers 228 and 234 are of substantially the same conductor material as the conductor cores 230 and 236 and become part of the respective conductor cores 230 and 236 after the deposition.

Again, during the manufacturing process, after deposition of the barrier layer 226, the seed layer 228, and the conductor core 230, a chemical-mechanical polishing (CMP) process is applied for planarization and the CMP uses a slurry containing ceria as an abrasive.

The present invention makes use of the highly oxidizing nature of ceria, such that chemical reducing agents will react with Ce(IV) oxide converting the Ce to the Ce(III) oxidation state, which is soluble in aqueous solutions compared to Ce(IV) oxide, or $CeO_2$, which is insoluble in most reagents. The reducing agents include, but are not limited to, phosphorus acid ($H_3PO_3$), hypophosphoric acid ($H_3PO_2$), oxalic acid ($H_2C_2O_4$), and L-ascorbic acid($C_6H_8O_6$).

In another embodiment, the present invention makes use of the complexation of Ce ions by ligand species, which form strong chemical bonds to Ce(III) to increase Ce(IV) solubility. Ligand species include, but are not limited to, ascorbic acid, citric acid, tartaric acid, malic acid, and glutamic acid.

Figure 4:
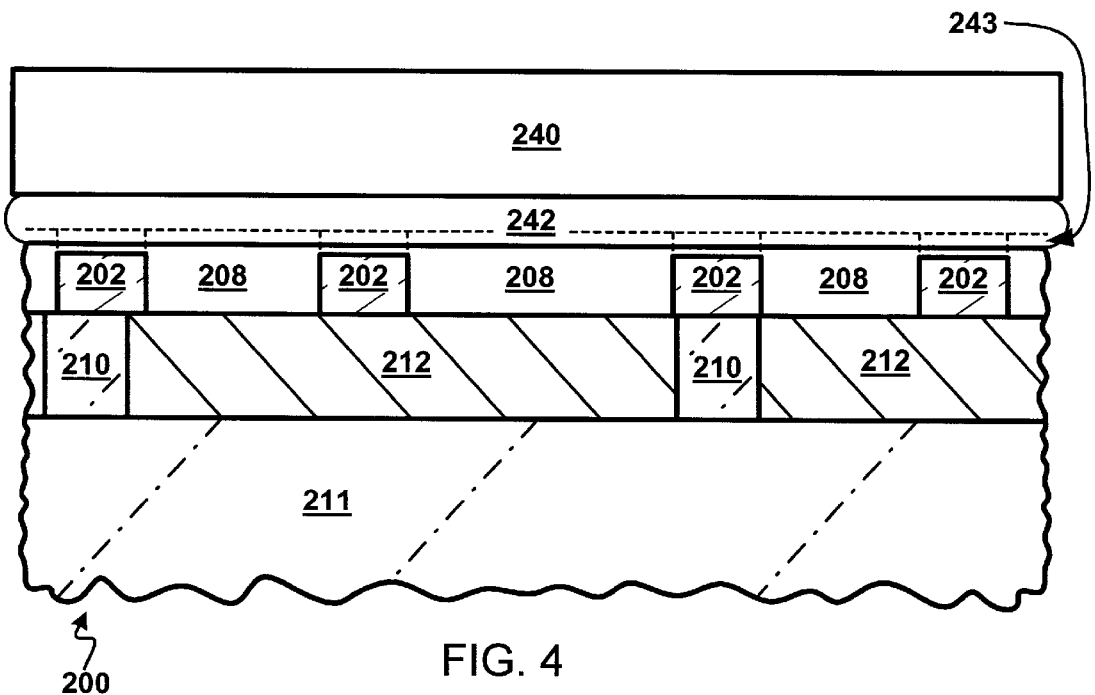
FIG. 4 is the chemical-mechanical polishing process of the present invention.

Referring now to FIG. 4, therein is shown a step in the CMP process in which a pad 240 is used to planarize a first channel surface of the semiconductor wafer 200. Therein is thus shown the planarization of the first channel 202 and first channel dielectric layer 208. A ceria containing slurry 242 is used between the pad 240 and the semiconductor wafer 200 for the removal of the material 243.

Figure 5:
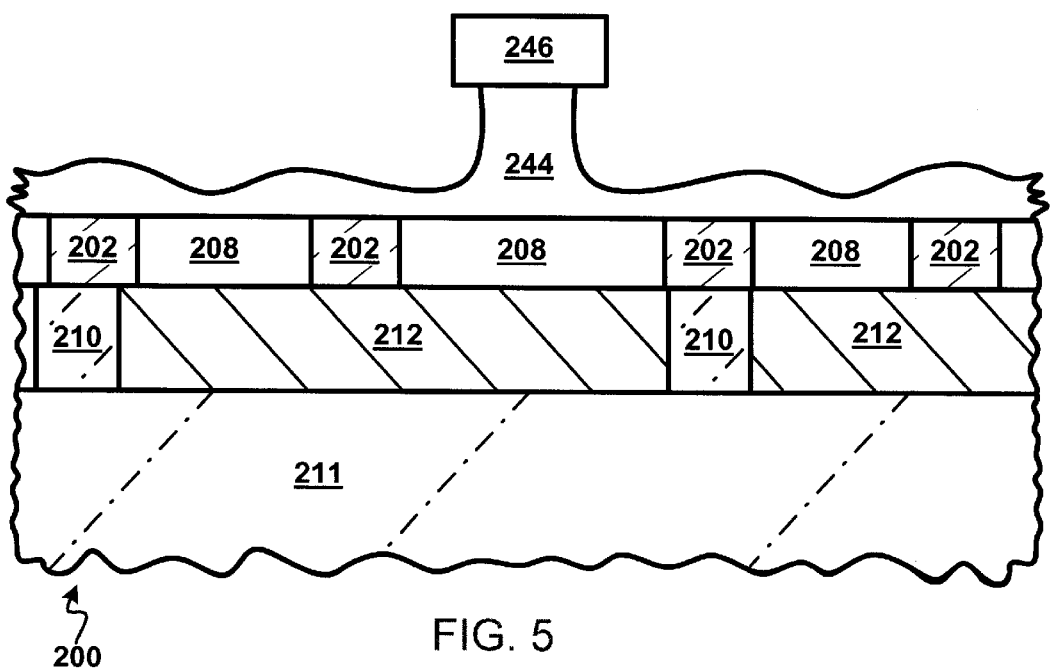
FIG. 5 is the ceria removal step of the present invention.

Referring now to FIG. 5, therein is shown the dispensation of a ceria dissolution solution 244 from a nozzle 246 which reacts with Ce(IV) oxide and converts the Ce to the Ce(III) oxidation state which is soluble in aqueous solutions while the ligand species causes complexation of the Ce ions. In one mode of the present invention, the Ce dissolution solution 244 is a solution of phosphorus acid ($H_3PO_3$), acting as a reducing agent, and ascorbic acid, acting as both a complexing agent and a reducing agent. The Ce dissolution solution 244 readily dissolves the ceria and Ce. The composition is in the range of 1%–5% of phosphorus acid and ascorbic acid in water. Dissolution of ceria and Ce is increased as this phosphorus acid to ascorbic acid concentrations increase. The pH of the best embodiment is approximately 2.0, which allows the solutions to be used on conventional water-brush scrubbing systems.

Alternative chemistries (to clean $CeO_2$ from wafers but not in copper damascene applications) with comparable etch rates currently used in the industry have a pH of equal to or less than 0.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$), silicon oxynitride (SiON) or low dielectric constant materials such as silicon carbide (SiC) with dielectric constants below 5.5.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

providing a semiconductor substrate having a semiconductor device provided thereon;

forming a dielectric layer on the semiconductor substrate;

forming an opening in the dielectric layer;

depositing a conductor core to fill the opening and connect to the semiconductor device;

chemical-mechanical polishing the dielectric layer using a slurry containing ceria, a Ce(IV) oxide;

dissolving residual ceria on the conductor core and dielectric layer using a reducing agent to react the Ce(IV) oxide to Ce(III) oxide.

2. The method of manufacturing an integrated circuit as claimed in claim 1 wherein dissolving residual ceria uses 1% to 5% by weight of the reducing agent in a solution.

3. The method of manufacturing an integrated circuit as claimed in claim 1 wherein dissolving residual ceria uses the reducing agent in a solution having a pH from 1.5 to 2.5.

4. The method of manufacturing an integrated circuit as claimed in claim 1 wherein dissolving residual ceria includes using a complexing agent.

5. The method of manufacturing an integrated circuit as claimed in claim 1 wherein dissolving residual ceria uses 1% to 5% by weight in water of a complexing agent.

6. The method of manufacturing an integrated circuit as claimed in claim 1 wherein dissolving residual ceria uses a complexing agent in a solution having a pH from 1.5 to 2.5.

7. The method of manufacturing an integrated circuit as claimed in claim 1 including water scrub brushing the conductor core and the dielectric layer after dissolving the residual ceria.

8. The method of manufacturing an integrated circuit as claimed in claim 1 including scrub brushing the conductor core and the dielectric layer using the reducing agent in solution.

9. The method of manufacturing an integrated circuit as claimed in claim 1 wherein depositing the conductor core deposits a metal selected from a group consisting of copper, aluminum, gold, silver, a compound thereof, and a combination thereof.

10. The method of manufacturing an integrated circuit as claimed in claim 1 wherein forming the dielectric layers uses dielectric materials selected from a group consisting of silicon oxide ($SiO_x$), silicon nitride ($Si_xN_x$), silicon oxynitride (SiON), a dielectric material with a dielectric constant from 4.2 to 3.9, and a low dielectric material with a dielectric constant below 3.9, and a combination thereof.

11. A method of manufacturing an integrated circuit comprising:

provided a semiconductor substrate having a semiconductor device provided thereon;

depositing a device oxide layer on the semiconductor substrate;

depositing a channel oxide layer on the device oxide layer;

forming a channel opening in the channel oxide layer;

depositing a barrier layer to line the channel opening;

depositing a seed layer to line the barrier layer;

depositing a conductor core to fill the channel opening and connect to the semiconductor device;

chemical-mechanical polishing the barrier layer, seed layer, and conductor core;

chemical-mechanical polishing the dielectric layer using a slurry containing ceria, a Ce(IV) oxide; and dissolving residual ceria on the conductor core and dielectric layer using a reducing agent to react the Ce(IV) oxide to Ce(III) oxide.

12. The method of manufacturing an integrated circuit as claimed in claim 11 wherein dissolving residual ceria includes using a reducing agent selected from a group consisting of phosphorus acid, hypophosphoric acid, oxalic acid, L-ascorbic acid and a combination thereof.

13. The method of manufacturing an integrated circuit as claimed in claim 11 wherein dissolving residual ceria uses 1% to 5% by weight phosphorous acid as the reducing agent in water.

14. The method of manufacturing an integrated circuit as claimed in claim 11 wherein dissolving residual ceria uses phosphorous acid as the reducing agent in a water solution having a pH from 1.5 to 2.5.

15. The method of manufacturing an integrated circuit as claimed in claim 11 wherein dissolving residual ceria includes using a complexing agent selected from a group consisting of ascorbic acid, citric acid, tartaric acid, malic acid, glutamic acid, and a combination thereof.

16. The method of manufacturing an integrated circuit as claimed in claim 11 wherein dissolving residual ceria includes using ascorbic acid as a complexing agent.

17. The method of manufacturing an integrated circuit as claimed in claim 11 wherein dissolving residual ceria uses 1% to 5% by weight ascorbic acid as a complexing agent in water.

18. The method of manufacturing an integrated circuit as claimed in claim 11 wherein dissolving residual ceria uses ascorbic acid as a complexing agent in a water solution having a pH from 1.5 to 2.5.

19. The method of manufacturing an integrated circuit as claimed in claim 11 including water scrub brushing the conductor core and the dielectric layer after dissolving the residual ceria.

20. The method of manufacturing an integrated circuit as claimed in claim 11 including water scrub brushing the conductor core and the dielectric layer using the reducing agent with a complexing agent in solution.

21. The method of manufacturing an integrated circuit as claimed in claim 11 wherein depositing the conductor core and seed layer deposit materials selected from a group consisting of copper, gold, silver, a compound thereof, and a combination thereof.

22. The method of manufacturing an integrated circuit as claimed in claim 11 wherein depositing the barrier layer deposits a material selected from a group consisting of titanium, tantalum, tungsten, a compound thereof, and a combination thereof.

23. The method of manufacturing an integrated circuit as claimed in claim 11 wherein forming the dielectric layers uses dielectric materials selected from a group consisting of silicon oxide, silicon nitride, silicon oxynitride, a dielectric material with a dielectric constant from 4.2 to 3.9, and a low dielectric material with a dielectric constant below 3.9, and a combination thereof.

\* \* \* \* \*